(12) United States Patent
Song

(10) Patent No.: US 8,928,129 B2
(45) Date of Patent: Jan. 6, 2015

(54) SEMICONDUCTOR PACKAGING FOR A MEMORY DEVICE AND A FABRICATING METHOD THEREOF

(75) Inventor: In-Sang Song, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/550,186

(22) Filed: Jul. 16, 2012

(65) Prior Publication Data

US 2013/0043568 A1 Feb. 21, 2013

(30) Foreign Application Priority Data

Aug. 16, 2011 (KR) ........................ 10-2011-0081305

(51) Int. Cl.
*H01L 23/552* (2006.01)

(52) U.S. Cl.
CPC .............. *H01L 24/97* (2013.01); *H01L 23/552* (2013.01); *H01L 23/49805* (2013.01);

(Continued)

(58) Field of Classification Search
CPC ..... H01L 2224/00; H01L 22/00; H01L 24/00; H01L 29/00; H01L 23/00; H01L 23/552; H01L 23/3121; H01L 23/48; H01L 23/49838; H01L 23/97; H01L 23/49805; H01L 23/0657; H01L 23/49816; H01L 23/3107; H01L 23/36; H01L 23/49548; H01L 23/49562; H01L 23/34; H01L 24/49; H01L 24/16; H01L 24/17; H01L 24/32; H01L 24/48; H01L 24/73; H01L 24/97; H01L 2224/32225; H01L 2224/97; H01L 2224/16227; H01L 2224/32145; H01L 2224/16225; H01L 2224/85; H01L 2224/73265; H01L 2224/45099; H01L 2224/13099; H01L 2224/48091; H01L 2224/06513; H01L 2224/01033; H01L 2224/49171; H01L 2224/2783; H01L 2224/27849; H01L 2224/80213; H01L 2224/80815; H01L 2924/00; H01L 2924/1431; H01L 2924/1434; H01L 2924/1435; H01L 2924/15311; H01L 2924/1815; H01L 2924/01029; H01L 2924/00014; H01L 2225/0651; H01L 2225/06541; H01L 2225/06565; H01L 2225/06513; H01L 2225/06517; H01L 2225/06555

USPC ......... 257/659, 660, 667, 676, 678, 687, 700, 257/734, 774, 777, E21.001, E21.499, 257/E23.114, E23.01, E23.061, 531; 438/15, 25, 26, 51, 55, 64, 106, 113

See application file for complete search history.

(56) References Cited

U.S. PATENT DOCUMENTS 7,829,981 B2 11/2010 Hsu
2004/0150977 A1* 8/2004 Hsieh ............................ 361/818

(Continued)

FOREIGN PATENT DOCUMENTS

JP 08-288686 11/1996
KR 1020010065753 7/2001

(Continued)

*Primary Examiner* — Chuong A Luu
*Assistant Examiner* — Moazzam Hossain
(74) *Attorney, Agent, or Firm* — F. Chau & Associates, LLC

(57) ABSTRACT

A semiconductor device includes a substrate, a semiconductor chip, a first molding member and a metal layer. The substrate includes a first ground pad formed therein, the first ground pad having a first exposed surface exposed at a first surface of the substrate. The semiconductor chip is formed on the first surface of the substrate. The first molding member is formed on the first surface of the substrate and covers the semiconductor chip while not covering the first exposed surface. The metal layer covers the first molding member and extends to lateral surfaces of the substrate while contacting the first exposed surface.

18 Claims, 13 Drawing Sheets

(51) Int. Cl.

| | | |
|---|---|---|
| *H01L 23/04* | (2006.01) | |
| *H01L 27/08* | (2006.01) | |
| *H01L 29/40* | (2006.01) | |
| *H01L 21/76* | (2006.01) | |
| *H01L 23/00* | (2006.01) | |
| *H01L 23/498* | (2006.01) | |
| *H01L 25/065* | (2006.01) | |

(52) U.S. Cl.
CPC ...... *H01L 23/49838* (2013.01); *H01L 25/0657* (2013.01); *H01L 2224/16146* (2013.01); *H01L 2224/16227* (2013.01); *H01L 2224/32145* (2013.01); *H01L 2224/48227* (2013.01); *H01L 2224/73265* (2013.01); *H01L 2224/97* (2013.01); *H01L 2225/0651* (2013.01); *H01L 2924/1431* (2013.01); *H01L 2924/1434* (2013.01); *H01L 2924/1435* (2013.01); *H01L 2924/15311* (2013.01); *H01L 2924/1815* (2013.01); *H01L 2225/06541* (2013.01); *H01L 2225/06565* (2013.01); *H01L 24/16* (2013.01); *H01L 24/32* (2013.01); *H01L 24/48* (2013.01); *H01L 2224/32225* (2013.01); *H01L 2224/48091* (2013.01); *H01L 2924/00014* (2013.01); *H01L 2924/01029* (2013.01); *H01L 2224/16225* (2013.01); *H01L 23/49816* (2013.01); *H01L 2924/3025* (2013.01)

USPC .......... 257/660; 257/531; 257/774; 257/734; 257/E23.01; 257/E23.114; 438/113; 438/15; 438/51; 438/106

(56) References Cited

U.S. PATENT DOCUMENTS

| | | | |
|---|---|---|---|
| 2008/0063232 A1* | 3/2008 | Song | 381/355 |
| 2009/0194851 A1* | 8/2009 | Chiu et al. | 257/660 |
| 2009/0230487 A1* | 9/2009 | Saitoh et al. | 257/419 |
| 2010/0072603 A1* | 3/2010 | Boon et al. | 257/690 |
| 2011/0006408 A1* | 1/2011 | Liao | 257/660 |

FOREIGN PATENT DOCUMENTS

| | | | |
|---|---|---|---|
| KR | 1020100070487 | 6/2010 | |
| WO | WO 2008062982 A1 * | 5/2008 | H05K 9/00 |

* cited by examiner (a)  (b)  (c)  (d)

1500

SEMICONDUCTOR PACKAGING FOR A MEMORY DEVICE AND A FABRICATING METHOD THEREOF

CROSS-REFERENCE TO RELATED APPLICATION

This application claims priority under 35 U.S.C. §119 to Korean Patent Application No. 10-2011-0081305 filed on Aug. 16, 2011 in the Korean Intellectual Property Office, the disclosure of which is incorporated by reference herein in its entirety.

BACKGROUND

1. Technical Field

The present inventive concept relates to a memory device and a fabricating method thereof.

2. Discussion of the Related Art

With the miniaturization of electronic devices and an increase in the data speed of these devices, electromagnetic interference (EMI) is a concern. Thus, methods for shielding the EMI occurring in such electronic devices are being studied.

As an example, after a semiconductor device (e.g., a semiconductor package) is mounted on a circuit board, an electromagnetic shielding can be disposed around the semiconductor device and connected to the circuit board. However, due to the height and width of the electromagnetic shielding, miniaturization of an electronic device having the semiconductor device is limited.

Further, it may be necessary to connect the electromagnetic shielding to a predetermined voltage signal. Therefore, the circuit board should include interconnections for applying the predetermined voltage signal to the electromagnetic shielding.

SUMMARY

The present inventive concept provides a memory device which is suitable for miniaturization of an electronic device.

The present inventive concept also provides a fabricating method of a memory device which is suitable for miniaturization of an electronic device.

According to an exemplary embodiment of the present inventive concept, there is provided a semiconductor device including a substrate including a first ground pad formed therein, the first ground pad having a first exposed surface exposed at a first surface of the substrate, a semiconductor chip formed on the first surface of the substrate, a first molding member formed on the first surface of the substrate and covering the semiconductor chip while not covering the first exposed surface, and a metal layer covering the first molding member and extending to lateral surfaces of the substrate while contacting the first exposed surface.

The first ground pad is positioned at a first side of the first molding member, and the substrate further includes a second ground pad positioned at a second side of the first molding member facing the first side of the first molding member.

The metal layer includes a first metal layer covering the first molding member, a second metal layer connected to the first metal layer and contacting the first exposed surface, and a third metal layer connected to the second metal layer and extending over portions of the lateral surfaces of the substrate.

The substrate includes a pair of first lateral surfaces facing each other in a first direction and a pair of second lateral surfaces facing each other in a second direction perpendicular to the first direction, and the third metal layer is formed along the first lateral surfaces or the second lateral surfaces but not at corners where the first lateral surfaces and the second lateral surfaces meet.

The substrate includes at least one recess region formed in the lateral surfaces of the substrate, and the third metal layer is formed in the recess region.

The recess region includes a plurality of first recess regions formed along the first lateral surfaces to be spaced apart from each other and a plurality of second recess regions formed along the second lateral surfaces to be spaced apart from each other.

The first ground pad further includes a second exposed surface exposed at one or more of the lateral surfaces of the substrate.

The metal layer contacts with the second exposed surface.

The metal layer includes a first metal layer covering the first molding member, a second metal layer connected to the first metal layer and contacting the first exposed surface, and a third metal layer connected to the second metal layer and extending over the lateral surfaces of the substrate, and the second metal layer has a top surface lower than that of the first metal layer.

The semiconductor device further includes a second molding member formed on the second metal layer.

The second molding member is also formed on the first metal layer.

According to an exemplary embodiment of the present inventive concept, there is provided a semiconductor device including a substrate including lateral surfaces, at least one recess region formed in the lateral surfaces and a ground pad formed in the substrate, the ground pad having one or more exposed surfaces exposed at a first surface of the substrate or at one or more of the lateral surfaces of the substrate, a semiconductor chip formed on the first surface of the substrate, a first molding member formed on the first surface of the substrate and covering the semiconductor chip, and a shielding layer covering the first molding member, extending to the lateral surfaces of the substrate while contacting the exposed surface and being formed in the recess region.

The lateral surfaces of the substrate include a pair of first lateral surfaces facing each other in a first direction and a pair of second lateral surfaces facing each other in a second direction perpendicular to the first direction, and the recess region extends along the first lateral surfaces in the first direction or along the second lateral surfaces in the second direction.

The recess region is not formed at corners where the first lateral surfaces and the second lateral surfaces meet.

The semiconductor device further includes a second molding member covering the shielding layer.

According to an exemplary embodiment of the present inventive concept, there is provided a fabricating method of a semiconductor device including: providing a mother substrate having a plurality of unit regions defined therein, wherein the unit regions are shaped as rectangles extending in first and second directions, and the mother substrate of each of the unit regions includes a ground pad having an exposed surface exposed to a first surface of the mother substrate; forming one or more holes penetrating the mother substrate in each of the unit regions in the first and second directions; forming a semiconductor chip on each of the unit regions; forming a molding member on each of the unit regions to cover the semiconductor chip; and forming a metal layer along a first surface of the molding member, lateral surfaces of the molding member and the exposed surface to extend to the holes.

According to an exemplary embodiment of the present inventive concept, there is provided a substrate including a ground pad; a semiconductor chip disposed on the substrate; and an electromagnetic shield overlapping the semiconductor chip and directly connected to the ground pad.

The ground pad and the semiconductor chip are disposed at a first surface of the substrate.

The electromagnetic shield is directly connected to a sidewall of the substrate.

The sidewall of the substrate is perpendicular to the first surface of the substrate.

The semiconductor device is a memory device.

BRIEF DESCRIPTION OF THE DRAWINGS

The above and other features of the present inventive concept will become more apparent by describing in detail exemplary embodiments thereof with reference to the attached drawings in which.

DETAILED DESCRIPTION OF THE EMBODIMENTS

Exemplary embodiments of the present inventive concept will be described more fully hereinafter with reference to the accompanying drawings. The present inventive concept may, however, be embodied in many different forms and should not be construed as being limited to the embodiments set forth herein.

Figure 1:
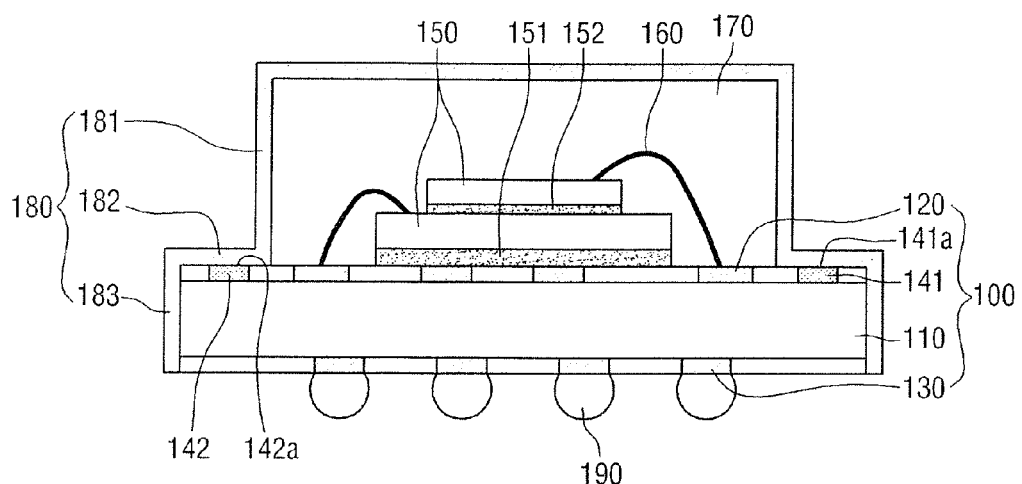
FIG. 1 is a cross-sectional view of a semiconductor device according to an exemplary embodiment of the present inventive concept.
Figure 2:
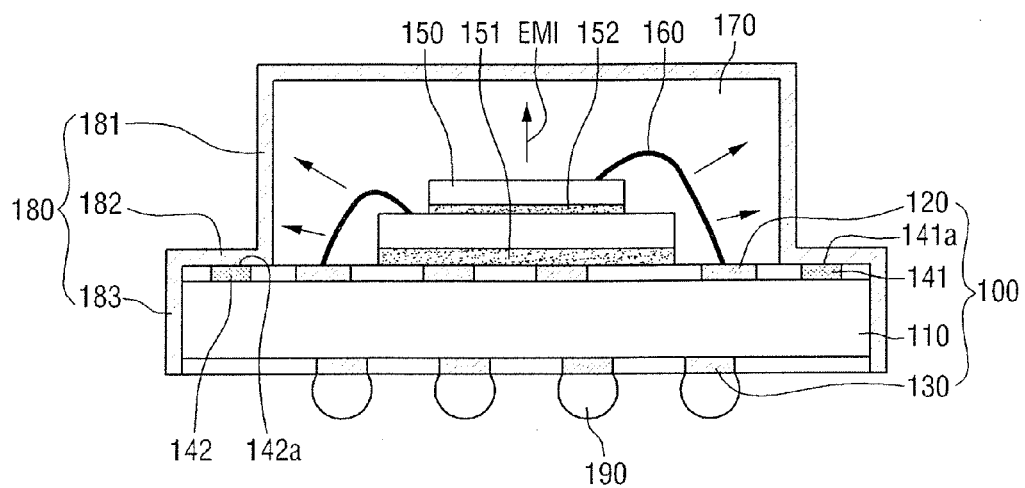
FIG. 2 a cross-sectional view illustrating a shielding operation of the semiconductor device shown in FIG. 1.

A semiconductor device according to an exemplary embodiment of the present inventive concept will first be described with reference to FIGS. 1 and 2. FIG. 1 is a cross-sectional view of a semiconductor device according to an exemplary embodiment of the present inventive concept, and FIG. 2 is a cross-sectional view illustrating a shielding operation of the semiconductor device shown in FIG. 1.

Referring to FIG. 1, the semiconductor device 1 according to an exemplary embodiment of the present inventive concept includes a substrate 100 having a first ground pad 141 and a second ground pad 142, a semiconductor chip 150, a first molding member 170, a metal layer 180, and external connection terminals 190.

The substrate 100 may include a core layer 110, the first ground pad 141, the second ground pad 142, a first interconnection 120, and a second interconnection 130.

The first interconnection 120 may be formed in one surface (e.g., a top surface) of the core layer 110 and may be exposed to a top surface of the substrate 100. The second interconnection 130 may be formed in the other surface (e.g., a bottom surface) of the core layer 110 and may be exposed to a bottom surface of the substrate 100. The core layer 110 may be positioned between the first interconnection 120 and the second interconnection 130. Although not shown in detail, the core layer 110 may include a via for electrically connecting the first interconnection 120 and the second interconnection 130. Driving signals (e.g., command signals, data signals, and so on) are transmitted to the semiconductor chip 150 through the external connection terminals 190, the second interconnection 130, the via, and the first interconnection 120. While FIG. 1 shows that the substrate 100 is a 3-layer substrate including the core layer 110, the first interconnection 120 and the second interconnection 130, the present inventive concept is not limited thereto. For example, the substrate 100 may be four or more layers.

The first ground pad 141 and the second ground pad 142 are positioned within the substrate 100 and include first exposed surfaces 141a and 142a exposed to the top surface of the substrate 100, respectively.

In addition, the first ground pad 141 may be formed at one side of the first molding member 170 and the second ground pad 142 may be formed at the other side of the first molding member 170 to face the first ground pad 141. In this case, the first ground pad 141 and the second ground pad 142 are not overlapped with the semiconductor chip 150 and the first molding member 170.

The first ground pad 141 and the second ground pad 142 may be formed of a metal, and a ground voltage may be applied thereto. The ground voltage may be applied to the first ground pad 141 and the second ground pad 142, which are electrically connected to an external device that applies the ground voltage. For example, the ground voltage may be transmitted to the first ground pad 141 and the second ground pad 142 through the external connection terminals 190, the second interconnection 130 and the via formed in the core layer 110.

The semiconductor chip 150 is formed on one surface of the substrate 100. The semiconductor chip 150 may be formed of silicon, silicon on insulator (SOI), silicon germanium, or the like, but is not limited thereto. Although not shown in detail, the semiconductor chip 150 may have multi-layered interconnections, a plurality of transistors, a plurality of passive elements, and so on integrated therein. FIG. 1 shows two stacked semiconductor chips 150. Adhesive layers 151 and 152 are interposed between the two semiconductor chips 150 and the substrate 100 to adhere the substrate 100 and the two semiconductor chips 150 to each other, but the present inventive concept is not limited thereto. In addition, FIG. 1 shows that the two semiconductor chips 150 and the substrate 100 are connected to each other through a wire bonding 160, but the present inventive concept is not limited thereto.

The first molding member 170 is formed on one surface of the substrate 100 to mold the semiconductor chips 150. The first molding member 170 does not mold the first ground pad 141 and the second ground pad 142. In other words, as shown in FIG. 1, the first exposed surface 141a of the first ground pad 141 and the first exposed surface 142a of the second ground pad 142 are exposed without being covered by the first molding member 170.

The first molding member 170 may be made of for example, an epoxy molding compound (EMC) or an underfill material, but is not limited thereto.

The metal layer 180 is formed to surround the first molding member 170 (or the semiconductor chips 150) and extend to lateral surfaces of the substrate 100 while contacting the first exposed surfaces 141a and 142a. In detail, the metal layer 180 includes a first metal layer 181 surrounding the first molding member 170, a second metal layer 182 connected to the first metal layer 181 and formed on a top surface of the substrate 100 to contact the first exposed surfaces 141a and 142a, and a third metal layer 183 connected to the second metal layer 182 and extending to the lateral surfaces of the substrate 100. Since the first metal layer 181 surrounds the first molding member 170, a top surface of the first metal layer 181 may be higher than a top surface of the second metal layer 182.

Since the second metal layer 182 contacts the first ground pad 141 and the second ground pad 142, the same ground voltage that is applied to the first ground pad 141 and the second ground pad 142 is applied to the second metal layer 182. In addition, the ground voltage may also be applied to the first metal layer 181 and the third metal layer 183 connected to the second metal layer 182. In other words, the ground voltage may be applied to the metal layer 180.

The metal layer 180 may be formed of, for example, Cu/Ni, Cu or Ag, but is not limited thereto.

Referring to FIG. 2, the electromagnetic interference (EMI) generated from the semiconductor chips 150 may be shielded by the metal layer 180. In detail, the EMIs emitted upwardly and laterally are shielded by the metal layer 180. In other words, the metal layer 180 may serve as an EMI shielding layer. The EMI emitted to the lateral surfaces of the substrate 100 may be shielded by the third metal layer 183. In the semiconductor device according to the current exemplary embodiment, since the EMIs emitted upwardly and laterally can be shielded in a package level, it is not necessary to separately install an electromagnetic shielding around the semiconductor package. Therefore, the use of the semiconductor device according to the current exemplary embodiment facilitates miniaturization of an electronic device.

The external connection terminal 190 may be formed on the bottom surface of the substrate 100. In the illustrated embodiment, the external connection terminal 190 is a solder ball, but is not limited thereto. For example, the external connection terminal 190 may be a conductive bump, a conductive spacer, a pin grid array (PGA), or the like.

Figure 3:
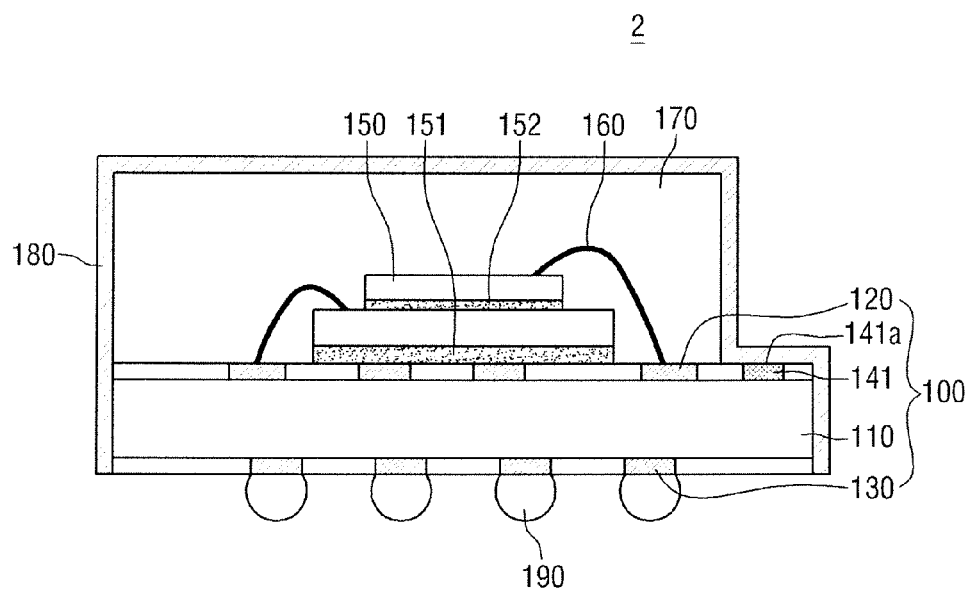
FIG. 3 is a cross-sectional view of a semiconductor device according to an exemplary embodiment of the present inventive concept.

Hereinafter, a semiconductor device according to an exemplary embodiment of the present inventive concept will be described with reference to FIG. 3. FIG. 3 is a cross-sectional view of a semiconductor device according to an exemplary embodiment of the present inventive concept. The same reference numerals are used to denote substantially the same components as those of the semiconductor device 1 of FIG. 1, and thus, a detailed description thereof will not be given.

Referring to FIG. 3, the semiconductor device 2 according to the illustrated embodiment is different from the semiconductor device 1 of FIG. 1 in that a substrate 100 does not include a second ground pad 142. Even if the substrate 100 does not include the second ground pad 142, since a metal layer 180 contacts a first exposed surface 141a of a first ground pad 141, a ground voltage may be applied to the metal layer 180, and the metal layer 180 may serve as a shielding layer.

In the illustrated embodiment, only the first ground pad 141 is formed in the substrate 100 such that a second ground pad 142 is not formed. However, in an alternative embodiment, only the second ground pad 142 may be formed in the substrate 100 such that the first ground pad 141 is not formed. In this case, the metal layer 180 may come into contact with a first exposed surface 142a of the second ground pad 142.

Figure 4:
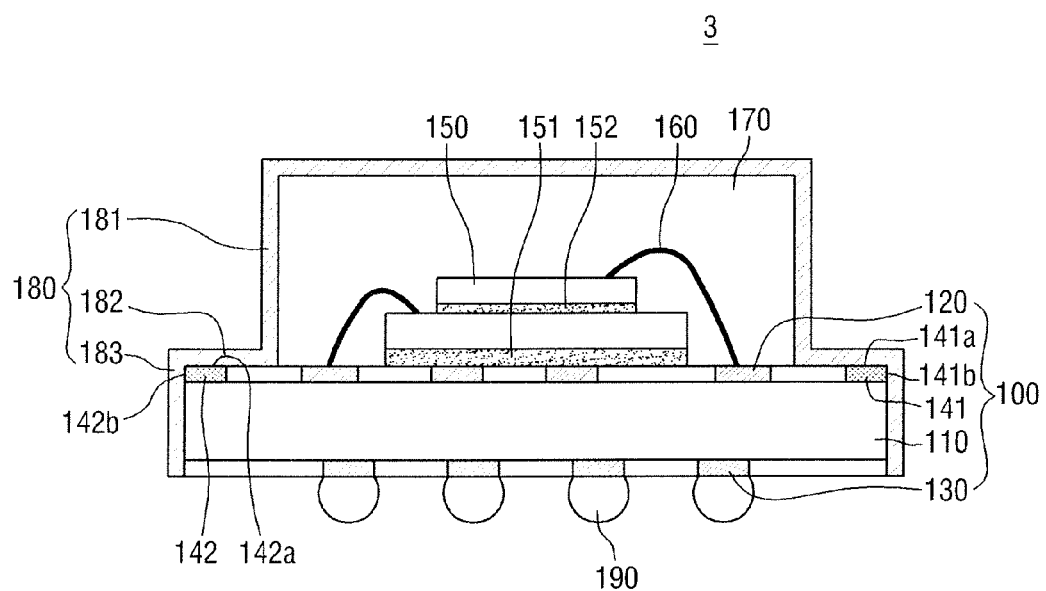
FIG. 4 is a cross-sectional view of a semiconductor device according to an exemplary embodiment of the present inventive concept.

Hereinafter, a semiconductor device according to an exemplary embodiment of the present inventive concept will be described with reference to FIG. 4. FIG. 4 is a cross-sectional view of a semiconductor device according to an exemplary embodiment of the present inventive concept. The same reference numerals are used to denote substantially the same components as those of the semiconductor device 1 of FIG. 1, and thus, a detailed description thereof will not be given.

Referring to FIG. 4, the semiconductor device 3 according to the illustrated embodiment is different from the semiconductor device 1 of FIG. 1 in that a first ground pad 141 and a second ground pad 142 further include not only first exposed surfaces 141a and 142a but also second exposed surfaces 141b and 142b, respectively.

The second exposed surfaces 141b and 142b are exposed to lateral surfaces of a substrate 100. Thus, the second exposed surfaces 141b and 142b contact a third metal layer 183 extending to the lateral surfaces of the substrate 100. Accordingly, an area in which the metal layer 180 contacts the first ground pad 141 and the second ground pad 142 is increased, thereby allowing the metal layer 180 to contact the first ground pad 141 and the second ground pad 142 in a more secure manner.

Figure 5:
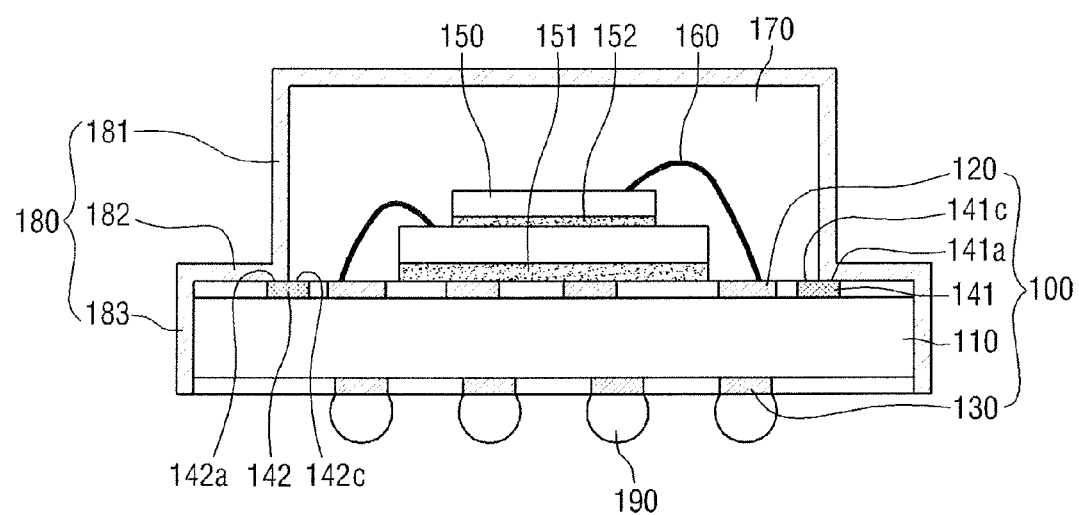
FIG. 5 is a cross-sectional view of a semiconductor device according to an exemplary embodiment of the present inventive concept.

Hereinafter, a semiconductor device according to an exemplary embodiment of the present inventive concept will be described with reference to FIG. 5. FIG. 5 is a cross-sectional view of a semiconductor device according to an exemplary embodiment of the present inventive concept. The same reference numerals are used to denote substantially the same components as those of the semiconductor device 1 of FIG. 1, and thus, a detailed description thereof will not be given.

Referring to FIG. 5, the semiconductor device 4 according to the illustrated embodiment is different from the semiconductor device 1 of FIG. 1 in that a metal layer 180 contacts only a portion of the exposed surface of a first ground pad 141 and only a portion of the exposed surface of a second ground pad 142.

Referring to FIG. 5, the first ground pad 141 and the second ground pad 142 include first exposed surfaces 141a and 142a and non-contacting surfaces 141c and 142c, respectively.

The first exposed surfaces 141a and 142a contact the metal layer 180 while being exposed to a top surface of the substrate 100. The non-contacting surfaces 141c and 142c are exposed to the top surface of the substrate 100 but are covered by a molding member 170, so that the non-contacting surfaces 141c and 142c are not brought into contact with the metal layer 180.

Figure 6:
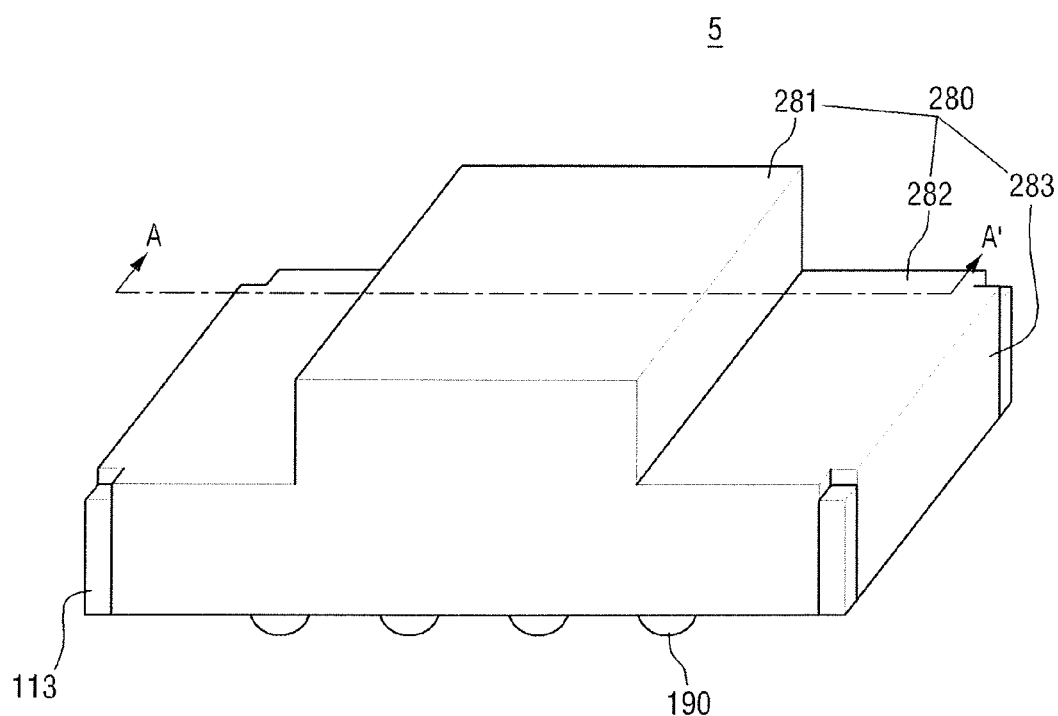
FIGS. 6 and 7 are perspective views of a semiconductor device according to an exemplary embodiment of the present inventive concept.
Figure 7:
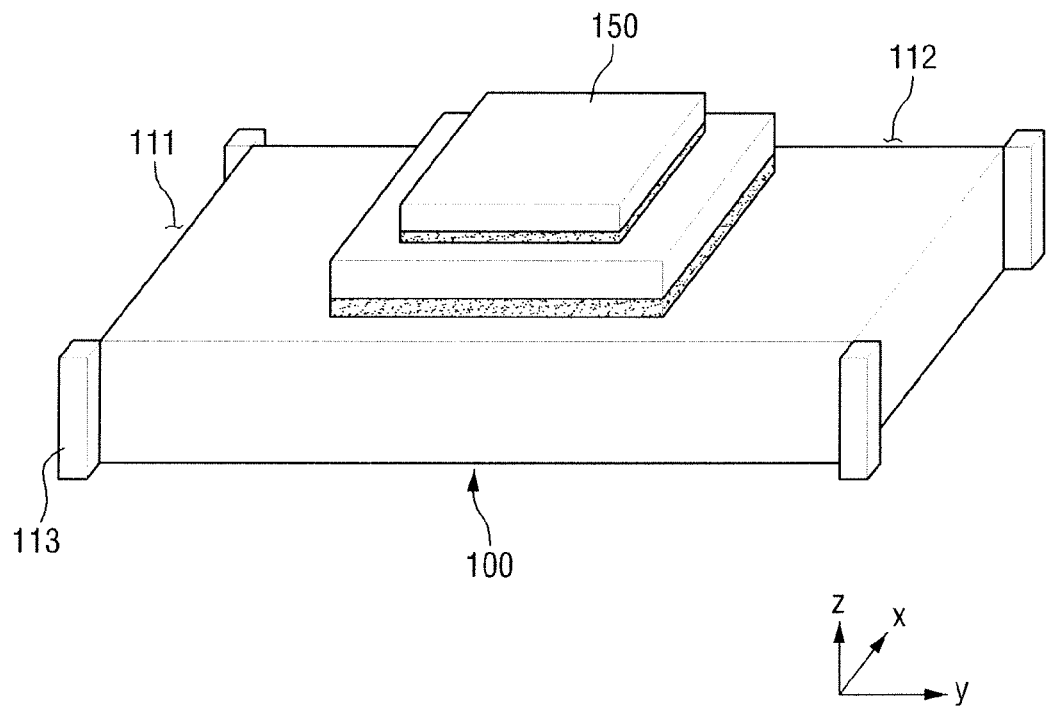

Hereinafter, a semiconductor device according to an exemplary embodiment of the present inventive concept will be described with reference to FIGS. 6 and 7. FIGS. 6 and 7 are perspective views of a semiconductor device according to an exemplary embodiment of the present inventive concept. In detail, FIG. 7 is a perspective view illustrating only a substrate and a semiconductor chip for explaining in more detail the semiconductor device according to this embodiment of the present inventive concept. Here, a cross section taken along line A-A' of FIG. 6 is substantially the same as that of FIG. 1. Components that are not illustrated in FIGS. 6 and 7 are substantially the same as those of the semiconductor device 1 of FIG. 1. The following description will focus on components that are substantially different from those of the semiconductor device 1 of FIG. 1.

Referring to FIGS. 1, 6 and 7, a metal layer 280 includes a first metal layer 281 surrounding a semiconductor chip 150, a second metal layer 282 connected to the first metal layer 281 and contacting the first exposed surfaces 141a and 142a of the first ground pad 141 and the second ground pad 142, and a third metal layer 283 connected to the second metal layer 282 and extending to lateral surfaces of the substrate 100. Here, the semiconductor device 5 according to the illustrated embodiment is different from the semiconductor device 1 of FIG. 1 in that the third metal layer 283 is formed only on portions of the lateral surfaces of the substrate 100.

Referring to FIG. 7, the substrate 100 includes a pair of first lateral surfaces facing each other and extended in a first direction X and a pair of second lateral surfaces facing each other and extended in a second direction Y perpendicular to the first direction X. Each of the first lateral surfaces has a first recess region 111 recessed from the first lateral surfaces, and each of the second lateral surfaces has a second recess region 112 recessed from the second lateral surfaces. The first recess region 111 is elongated along the first lateral surfaces in the first direction X, and the second recess region 112 is elongated along the second lateral surfaces in the second direction Y. However, the first recess region 111 and the second recess region 112 are not extended to corners 113 where the first lateral surfaces and the second lateral surfaces meet.

Referring back to FIG. 6, the third metal layer 283 is formed in the first recess region 111 and the second recess region 112. Thus, the third metal layer 283 is not formed at the corners 113, such that it is formed only on portions of the lateral surfaces. In other words, the third metal layer 283 is formed along the pair of first lateral surfaces and the pair of second lateral surfaces, but it is not formed at the corners 113 where the first lateral surfaces and the second lateral surfaces meet.

While FIG. 7 illustrates that the first recess region 111 and the second recess region 112 are each formed as a continuous region elongated along the first and second lateral surfaces of the substrate 100, respectively, the present inventive concept is not limited thereto. For example, a plurality of recess regions may be formed on one lateral surface of the substrate 100.

Figure 8:
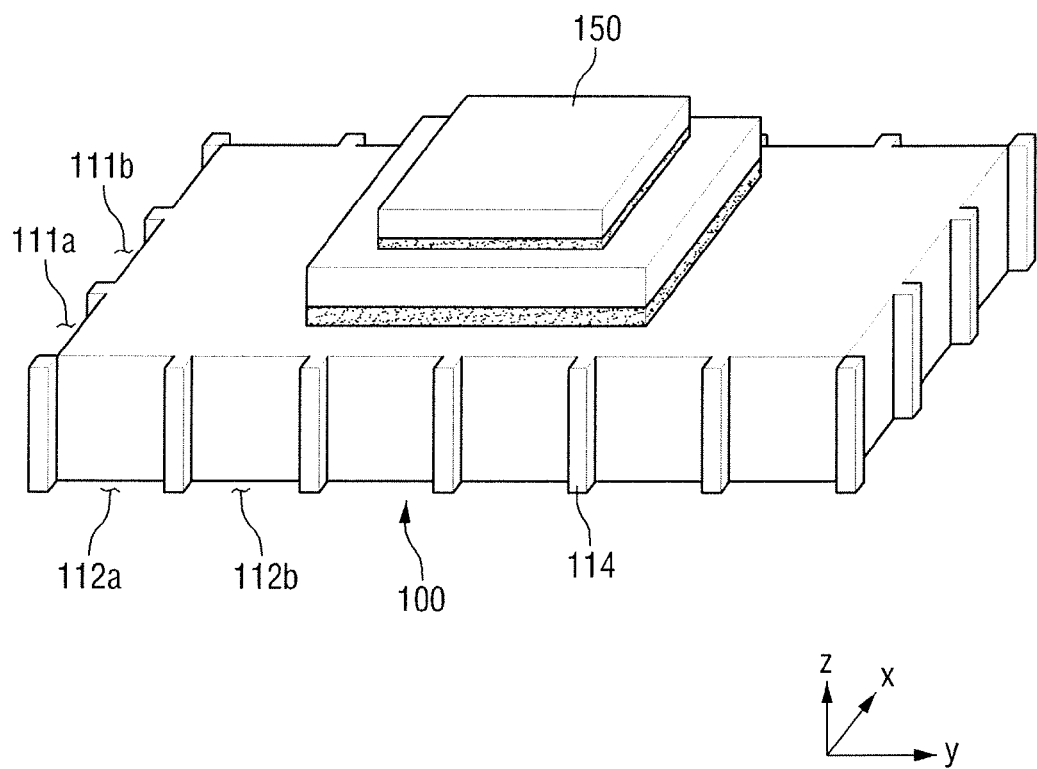
FIG. 8 is a perspective view of a semiconductor device according to an exemplary embodiment of the present inventive concept.

Hereinafter, a semiconductor device according to an exemplary embodiment of the present inventive concept will be described with reference to FIG. 8. FIG. 8 is a perspective view of a semiconductor device according to an exemplary embodiment of the present inventive concept. FIG. 8 illustrates only a substrate and a semiconductor chip, and components that are not illustrated in FIG. 8 are substantially the same as those of the semiconductor device 1 of FIG. 1.

Referring to FIG. 8, a plurality of first recess regions 111a and 111b and a plurality of second recess regions 112a and 112b are formed on lateral surfaces of the substrate 100. The plurality of first recess regions 111a and 111b are formed on the lateral surfaces of the substrate 100 in a first direction X to be separated from each other. The plurality of second recess regions 112a and 112b are formed on the lateral surfaces of the substrate 100 in a second direction Y to be separated from each other. Here, a third metal layer 283 is formed in the first recess regions 111a and 111b and the second recess regions 112a and 112b. The third metal layer 283 is not formed on lateral surfaces 114 between the first recess regions 111a and 111b and the second recess regions 112a and 112b. Consequently, the third metal layer 283 is formed only on portions of the lateral surfaces of the substrate 100.

While FIG. 8 shows that the first recess regions 111a and 111b and the second recess regions 112a and 112b have horizontally rectangular shapes, the present inventive concept is not limited thereto. For example, the horizontal shape formed by the first recess regions 111a and 111b and the second recess regions 112a and 112b may be horizontally hemispherical or oval.

Figure 9:
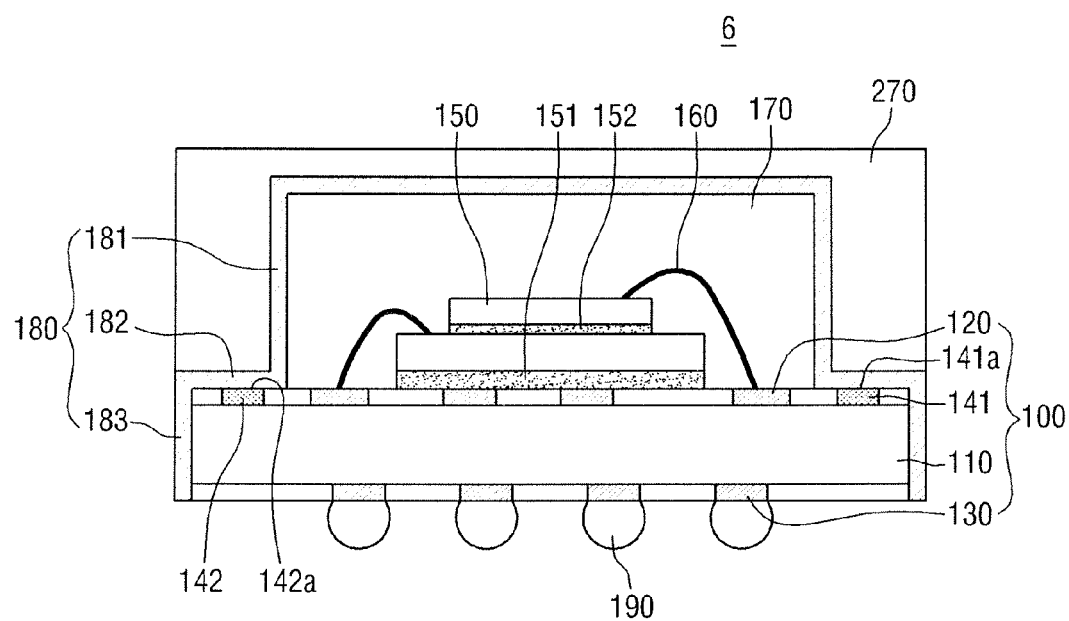
FIG. 9 is a cross-sectional view of a semiconductor device according to an exemplary embodiment of the present inventive concept.

Hereinafter, a semiconductor device according to an exemplary embodiment of the present inventive concept will be described with reference to FIG. 9. FIG. 9 is a cross-sectional view of a semiconductor device according to an exemplary embodiment of the present inventive concept. The same reference numerals are used to denote substantially the same components as those of the semiconductor device 1 of FIG. 1, and thus, a detailed description thereof will not be given.

Referring to FIG. 9, the semiconductor device 6 according to the illustrated embodiment is different from the semiconductor device 1 of FIG. 1 in that a second molding member 270 is further provided.

The second molding member 270 may be formed on a second metal layer 182. As shown, the second molding member 270 may be formed on a substrate 100 to mold a first metal layer 181 and the second metal layer 182. In addition, although FIG. 9 illustrates that the second molding member 270 may be formed to cover the first metal layer 181, the second molding member 270 may be formed on the second metal layer 182 to have the same height as the first molding member 170. In this case, the second molding member 270 is formed only on the second metal layer 182 and not on the first metal layer 181.

The first molding member 170 surrounding the semiconductor chip 150 is formed so as not to cover the first contact pad 141 and the second contact pad 142, yet opposite sides of the first molding member 170 may be vulnerable to impact. In this embodiment, impact resistance of the semiconductor device 6 can be enhanced by forming the second molding member 270 at the opposite sides of the first molding member 170.

The second molding member 270 may be made of the same material as the first molding member 170. For example, the second molding member 270 may be made of an EMC or an under-fill material, but is not limited thereto.

Figure 10:
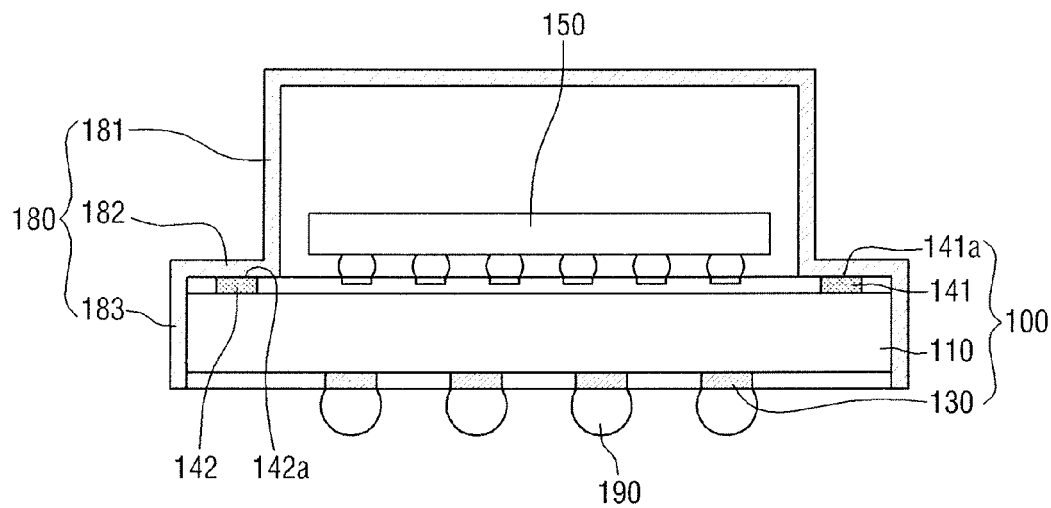
FIG. 10 is a cross-sectional view of a semiconductor device according to an exemplary embodiment of the present inventive concept.

Hereinafter, semiconductor devices according to exemplary embodiments of the present inventive concept will be described with reference to FIGS. 10 and 11. FIG. 10 is a cross-sectional view of a semiconductor device according to an exemplary embodiment of the present inventive concept, and FIG. 11 is a cross-sectional view of a semiconductor device according to an exemplary embodiment of the present inventive concept.

Referring first to FIG. 10, in the semiconductor device according to the illustrated embodiment, a semiconductor chip 150 is shaped of a flip chip.

Figure 11:
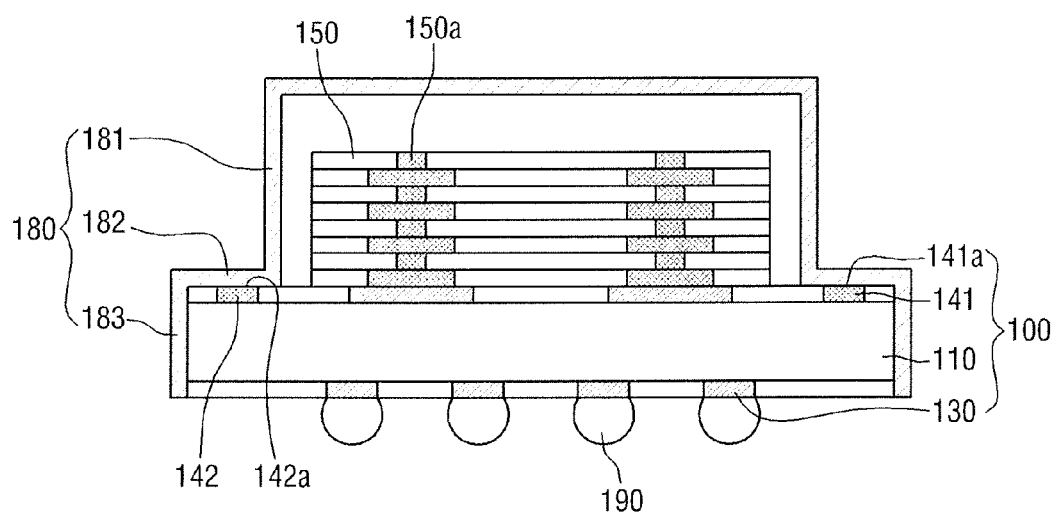
FIG. 11 is a cross-sectional view of a semiconductor device according to an exemplary embodiment of the present inventive concept.

Next, referring to FIG. 11, the semiconductor device according to the illustrated embodiment may include a plurality of stacked semiconductor chips 150, and each of the semiconductor chips 150 may include a penetration electrode 150a. The penetration electrode 150a may be a through-silicon via. As shown in FIG. 11, the penetration electrode 150a may be formed to penetrate the semiconductor chips 150 from one surface to the other surface of each of the semiconductor chips 150. The penetration electrode 150a may electrically connect the one surface of the semiconductor chip 150 to the other surface thereof.

Figure 12:
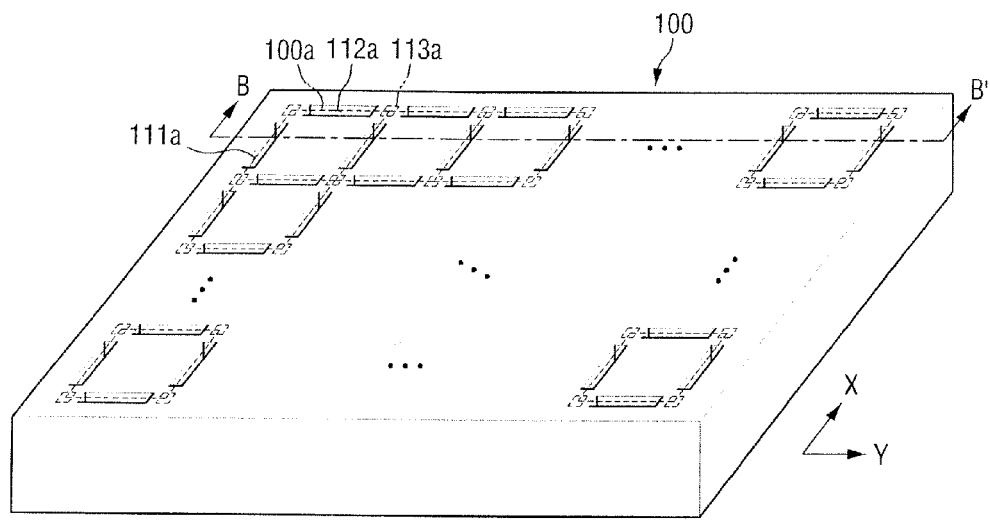
FIGS. 12 to 16 are a perspective view and cross-sectional views of an intermediate structure in a fabricating method of a semiconductor device according to an exemplary embodiment of the present inventive concept.

Hereinafter, a fabricating method of a semiconductor device according to an exemplary embodiment of the present inventive concept will be described with reference to FIGS. 12 to 16. FIG. 12 is a perspective view of an intermediate structure in a fabricating method of a semiconductor device according to an exemplary embodiment of the present inventive concept. FIGS. 13 to 16 are cross-sectional views of an intermediate structure in a fabricating method of a semiconductor device according to an exemplary embodiment of the present inventive concept and illustrate a cross section taken along line B-B' of FIG. 12.

Figure 13:
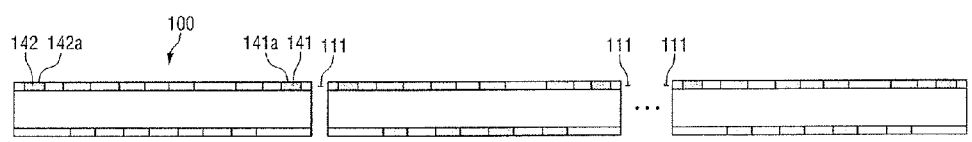

Referring to FIGS. 12 and 13, a mother substrate 100 is provided, the mother substrate 100 having a plurality of unit regions 100a defined therein. The unit regions 100a may each include a first ground pad 141 and a second ground pad 142, and one or more holes 111 and 112 are formed in the mother substrate 100.

The unit regions 100a are shaped of rectangles elongated in first and second directions. A semiconductor chip may be stacked on each of the unit regions 100a and a molding member that molds the semiconductor chip is provided, forming a unit package. The first ground pad 141 and the second ground pad 142 include first exposed surfaces 141a and 142a exposed to a top surface of the substrate 100, respectively.

The holes 111 and 112 are formed in the unit regions 100a to penetrate top and bottom surfaces of the substrate 100. The first hole 111 may extend in a first direction X, and the second hole 112 may extend in a second direction Y. Here, the first hole 111 and the second hole 112 may not contact each other. For example, the first hole 111 and the second hole 112 may extend in the first direction X or the second direction Y but may not extend to corners 113 of the unit regions 100a, so that they may not contact each other. In addition, two adjacent unit regions 100a may share one hole 111 or 112. FIG. 12 shows that four holes are formed along four sides of each rectangular unit region 100a. While FIG. 12 shows that one hole is formed along each side of each of the unit regions 100a, the present inventive concept is not limited thereto. For example, a plurality of holes may be formed along the respective sides of the unit regions 100a. In addition, the shapes of the holes are not limited to those illustrated herein, and the holes may have horizontally circular or oval shapes.

Figure 14:
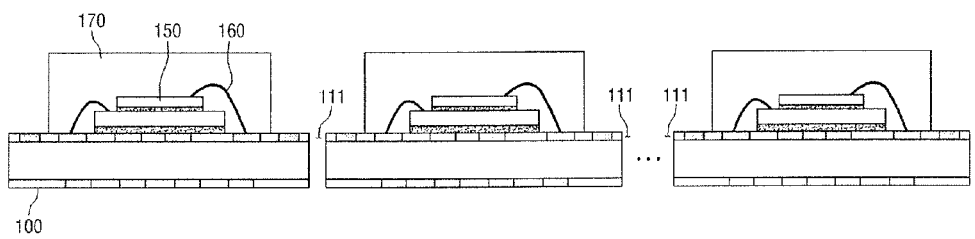

Next, referring to FIG. 14, a plurality of semiconductor chips 150, and a first molding member 170 that molds the plurality of semiconductor chips 150 are formed on the substrate 100 of the respective unit regions 100a. Here, the first molding member 170 is formed so as not to cover the first ground pad 141 and the second ground pad 142. In addition, the first molding member 170 that molds the plurality of semiconductor chips 150 is not integrally formed over the entire surface of the substrate 100. Instead, the first molding member 170 is independently formed on each of the unit regions 100a. FIG. 14 shows that the plurality of semiconductor chips 150 are connected to the substrate 100 by wire bonding 160, but the present inventive concept is not limited thereto.

Figure 15:
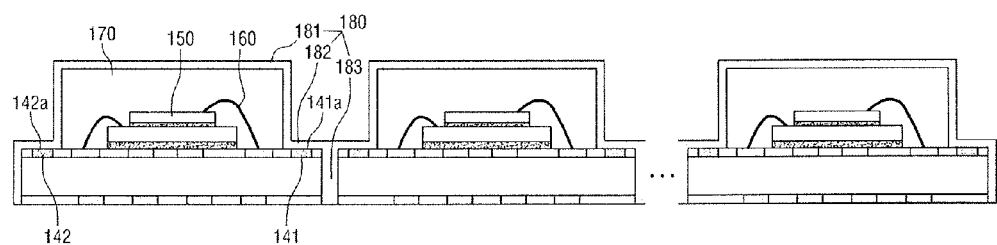

Referring to FIG. 15, a metal layer 180 is formed to extend into the holes 111 and 112 along one surface (e.g., a top surface) and lateral surfaces of the first molding member 170, and first exposed surfaces 141a and 142a of the first and second ground pads 141 and 142. Accordingly, the metal layer 180 may include a first metal layer 181 surrounding the first molding member 170, a second metal layer 182 connected to the first metal layer 181 and contacting the first ground pad 141 and the second ground pad 142, and a third metal layer 183 connected to the second metal layer 182 and extending to the lateral surfaces of the substrate 100. Here, the third metal layer 183 is formed in the holes 111 and 112 and extends to the lateral surfaces of the substrate 100. The metal layer 180 may be formed by plating or spraying, but is not limited thereto.

Figure 16:
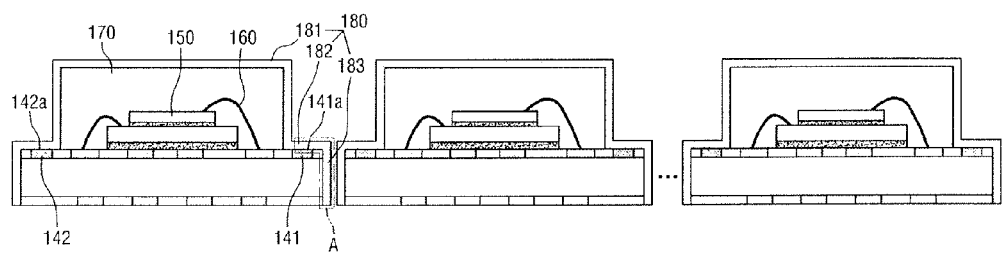

Referring to FIG. 16, a plurality of unit packages is formed by cutting the mother substrate 100 along the holes 111 and 112. In detail, insides of the holes 111 and 112 are cut using a blade in a direction perpendicular to the substrate 100, thereby dividing it into the plurality of unit packages. In addition, although not shown, before the dividing, a second molding member that molds the metal layer 180 may further be formed on the substrate 100.

Figure 17:
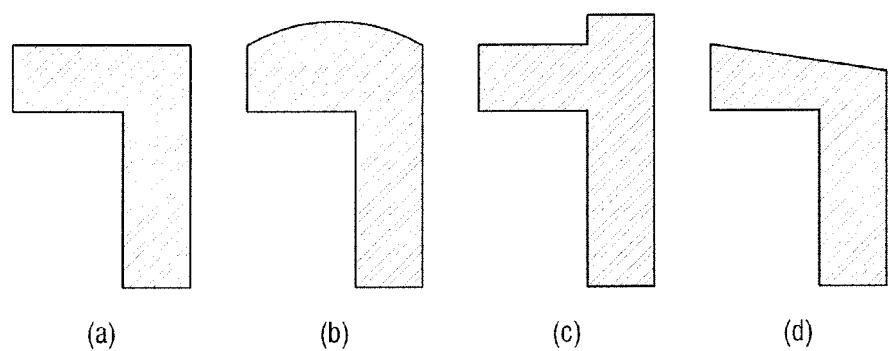
FIG. 17 is an enlarged view of 'A' in FIG. 16 in various exemplary configurations.

FIG. 17 illustrates various modifications of a cross section of a metal layer 180, as indicated by 'A' in FIG. 16. For example, the metal layer 180 may have cross sections shown in FIG. 17(a)-(d) after being cut along the holes 111 or 112, wherein the cross sections represent a portion of the metal layer 180 formed on lateral surfaces of the substrate 100 and in contact with the first ground pad 141 or the second ground pad 142. For example, as shown in FIG. 17(a), the metal layer 180 may have an upside-down 'L' shaped cross section. As shown in FIG. 17(b), the metal layer 180 may have an upside-down 'L' shaped cross section with a convex top portion. As shown in FIG. 17(c), the metal layer 180 may have an upside-down 'L' shaped cross section with a protruding corner. As shown in FIG. 17(d), the metal layer 180 may have an upside-down 'L' shaped cross section with a tapering top portion.

In the fabricating method of the semiconductor device according to the illustrated embodiment of the present inventive concept, a metal layer extending to the lateral surfaces of the substrate 100 may be formed using the holes 111 and 112 penetrating from the top surface of the substrate 100 to the bottom surface of the substrate 100. In addition, since it is not necessary to adhere a carrier to the substrate 100, half the dice and then, remove the carrier to form a metal layer for each unit package, the fabricating process may be simplified.

Hereinafter, semiconductor systems according to exemplary embodiments of the present inventive concept will be described with reference to FIGS. 18 to 20.

Figure 18:
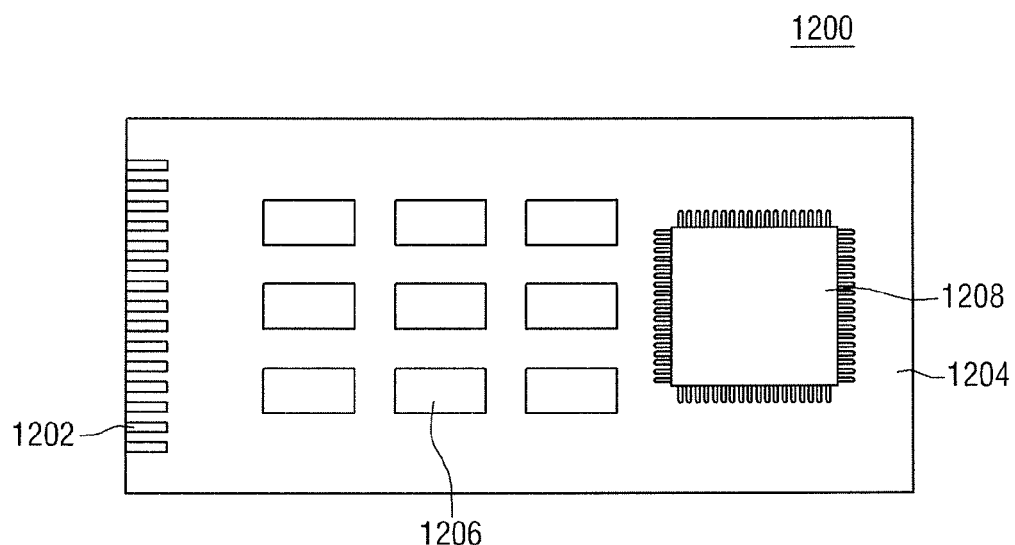
FIG. 18 is a plan view of a semiconductor system according to an exemplary embodiment of the present inventive concept.

FIG. 18 is a plan view of a semiconductor system according to an exemplary embodiment of the present inventive concept.

Referring to FIG. 18, the semiconductor system 1200 according to an exemplary embodiment of the present inventive concept may be a package module. The semiconductor system 1200 may include a module substrate 1204 provided with an external connection terminal 1202, and semiconductor devices 1206 and 1208. In the current exemplary embodiment, the semiconductor device 1208 is packaged with a quad flat package (QFP), but the present inventive concept is not limited thereto. Here, the semiconductor devices 1206 and 1208 may be at least one of the semiconductor devices shown in FIGS. 1 to 11. In other words, each of the semiconductor devices 1206 and 1208 may include a substrate including a first ground pad having a first exposed surface exposed to a top surface of the substrate, a semiconductor chip formed on the top surface of the substrate, and a metal layer extending to lateral surfaces of the substrate while contacting the first ground pad.

Figure 19:
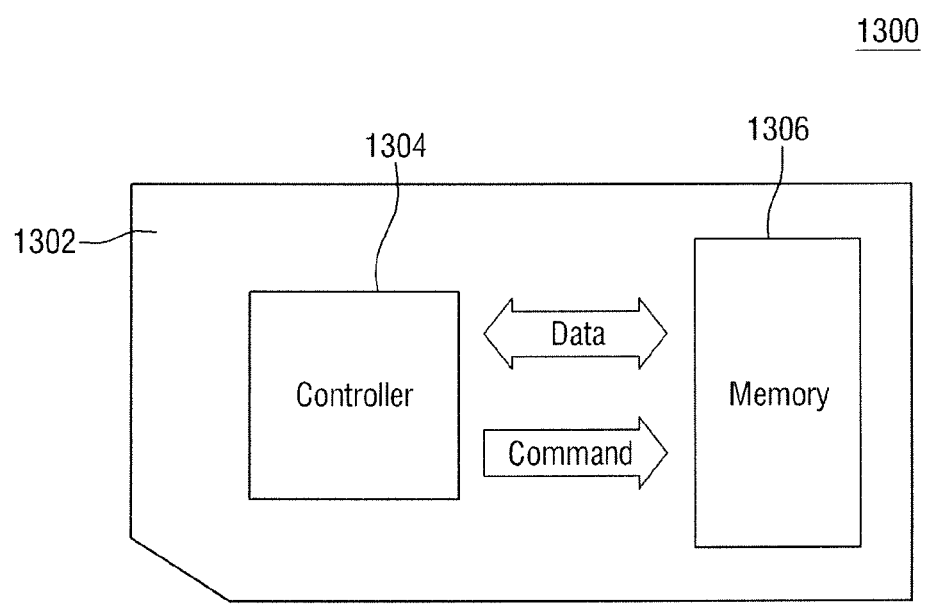
FIG. 19 is a block view of a semiconductor system according to an exemplary embodiment of the present inventive concept.

FIG. 19 is a block view of a semiconductor system according to an exemplary embodiment of the present inventive concept.

Referring to FIG. 19, the semiconductor system 1300 according to an exemplary embodiment of the present inventive concept may be a memory card. The semiconductor system 1300 may include a controller 1304 and a memory 1306 provided in a housing 1302. The controller 1304 and the memory 1306 may exchange electric signals. For example, the controller 1304 and the memory 1306 may exchange data in response to a command of the controller 1304. Accordingly, the semiconductor system 1300 may store data in the memory 1306 or may output the data stored in the memory 1306 to the outside. The controller 1304 and the memory 1306 may be at least one of the semiconductor devices shown in FIGS. 1 to 11.

The semiconductor system 1300 may be used as data storage media for various types of portable devices. For example, the semiconductor system 1300 may include a multimedia card (MMC) or a secure digital (SD) card.

Figure 20:
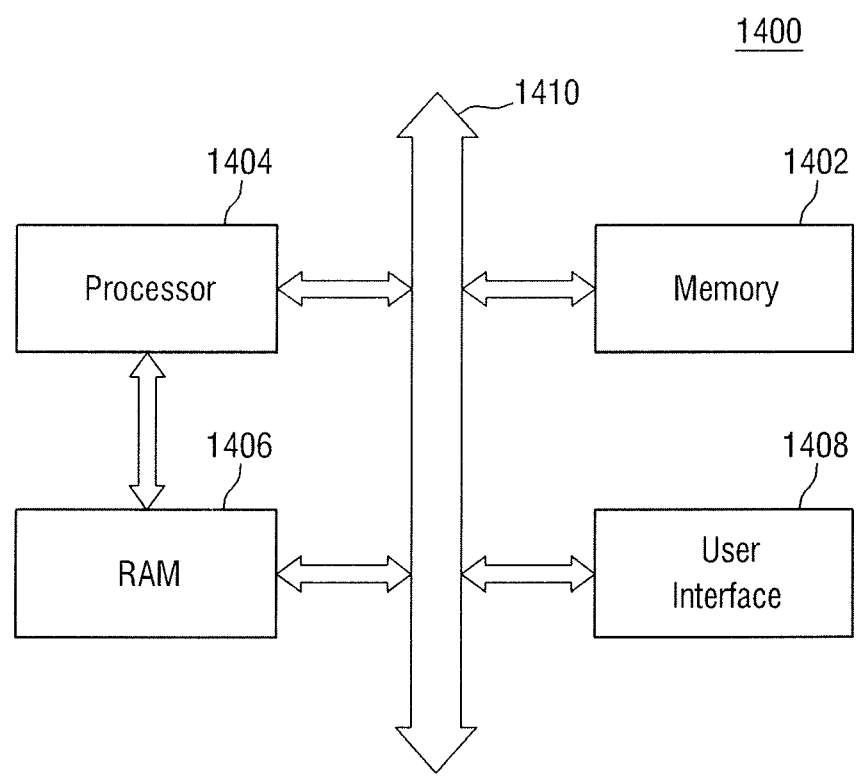
FIG. 20 is a block view of a semiconductor system according to an exemplary embodiment of the present inventive concept.
Figure 21:
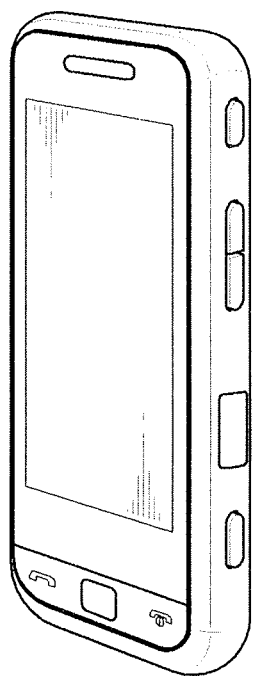
FIG. 21 illustrates an example of an electronic device to which the semiconductor system shown in FIG. 20 may be applied.

FIG. 20 is a block view of a semiconductor system according to an exemplary embodiment of the present inventive concept, and FIG. 21 illustrates an example of an electronic device to which the semiconductor system shown in FIG. 20 may be applied.

Referring to FIG. 20, the semiconductor system 1400 according to the illustrated embodiment of the present inventive concept may include a memory 1402, a processor 1404, a random access memory (RAM) 1406, and a user interface 1408, which perform data communication using a bus 1410. The processor 1404 may execute a program and may control the semiconductor system 1400. The RAM 1406 may be used as an operation memory of the processor 1404. The processor 1404 and the RAM 1406 may be incorporated into one package. For example, a logic chip incorporating the processor 1404 and a memory chip incorporating the RAM 1406 may be in a single package with wireless communication capabilities. The user interface 1408 may be used to input/output data to/from the semiconductor system 1400. The memory system 1402 may store codes for operating the processor 1404, data processed by the processor 1404, or external input data. The memory system 1402 may include a controller and a memory and may be substantially the same or similar to the memory card 1300 shown in FIG. 19.

The semiconductor system 1400 may be applied to electronic controllers for various types of electronic devices. For example, the semiconductor system 1400 may be applied to a cellular phone (e.g., 1500 of FIG. 21). In addition, the semiconductor system 1400 may be applied to portable game consoles, portable notebook computers, MP3 players, a navigation system, a solid state disk (SSD), automobiles or household appliances.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A semiconductor device, comprising:
a substrate including a first ground pad formed therein, the first ground pad having a first exposed surface exposed at a first surface of the substrate;
a semiconductor chip formed on the first surface of the substrate;
a first molding member formed on the first surface of the substrate and covering the semiconductor chip while not covering the first exposed surface; and
a metal layer covering the first molding member and overlapping lateral surfaces of the substrate while contacting the first exposed surface,
wherein the metal layer includes a first metal layer covering the first molding member, a second metal layer connected to the first metal layer and contacting the first exposed surface, and a third metal layer connected to the second metal layer and overlapping the lateral surfaces of the substrate,
wherein the first metal layer is disposed parallel to a side of the first molding member, the second metal layer is disposed parallel to the first surface of the substrate and is perpendicularly connected to the first metal layer, and the third metal layer is disposed parallel to the lateral surface of the substrate it overlaps and is perpendicularly connected to the second metal layer,
wherein the second metal layer is connected to the first ground pad through the first exposed surface,
wherein the substrate includes a pair of first lateral surfaces facing each other in a first direction and a pair of second lateral surfaces facing each other in a second direction perpendicular to the first direction, and a recess region extends along the first lateral surfaces in the direction or along the second lateral surfaces in the second direction,
wherein the recess region is not formed at corners where the first lateral surfaces and the second lateral surfaces meet.

2. The semiconductor device of claim 1, wherein the first ground pad is positioned at a first side of the first molding member, and the substrate further includes a second ground pad positioned at a second side of the first molding member facing the first side of the first molding member.

3. The semiconductor device of claim 1, wherein the third metal layer is formed along the first lateral surfaces or the second lateral surfaces but not at corners where the first lateral surfaces and the second lateral surfaces meet.

4. The semiconductor device of claim 1, wherein the third metal layer is formed in the recess region.

5. The semiconductor device of claim 4, wherein the recess region includes a plurality of first recess regions formed along the first lateral surfaces to be spaced apart from each other and a plurality of second recess regions formed along the second lateral surfaces to be spaced apart from each other.

6. The semiconductor device of claim 1, wherein the first ground pad further includes a second exposed surface exposed at one or more of the lateral surfaces of the substrate.

7. The semiconductor device of claim 6, wherein the metal layer contacts with the second exposed surface.

8. The semiconductor device of claim 1, wherein the second metal layer has a top surface lower than of the first metal layer.

9. The semiconductor device of claim 8, further comprising a second molding member formed on the second metal layer.

10. The semiconductor device of claim 9, wherein the second molding member is also formed on the first metal layer.

11. A semiconductor device, comprising:
- a substrate including lateral surfaces, at least one recess region formed in the lateral surfaces and a ground pad formed in the substrate, the ground pad having one or more exposed surfaces exposed at a first surface of the substrate or one or more of the lateral surfaces of the substrate;
- a semiconductor chip formed on the first surface of the substrate;
- a first molding member formed on the first surface of the substrate and covering the semiconductor chip; and
- a shielding layer covering the first molding member, overlapping the lateral surfaces of the substrate while contacting the exposed surface and being formed in the recess region,
- wherein the lateral surfaces of the substrate include a pair of first lateral surfaces facing each other in a first direction and a pair of second lateral surfaces facing each other in a second direction perpendicular to the first direction, and the recess region extends along the first lateral surfaces in the first direction or along the second lateral surfaces in the second direction,
- wherein the recess region is not formed at corners where the first lateral surfaces and the second lateral surfaces meet.

12. The semiconductor device of claim 11, further comprising a second molding member covering the shielding layer.

13. A semiconductor device, comprising:
- a substrate including a ground pad;
- a semiconductor chip disposed on the substrate; and
- an electromagnetic shield overlapping the semiconductor chip and directly connected to the ground pad,
- wherein the electromagnetic shield overlaps a first sidewall of the substrate and is disposed in a recess formed on the first sidewall, the recess being formed along the first sidewall except for a corner of the first sidewall where the first sidewall meets a second sidewall of the substrate.

14. The semiconductor device of claim 13, wherein the ground pad and the semiconductor chip are disposed at a first surface of the substrate.

15. The semiconductor device of claim 14, wherein the electromagnetic shield is directly connected to a sidewall of the substrate.

16. The semiconductor device of claim 15, wherein the first sidewall of the substrate is perpendicular to the first surface of the substrate.

17. The semiconductor device of claim 12, wherein the semiconductor device is a memory device.

18. A semiconductor device, comprising:
- a substrate including a first ground pad formed therein, the first ground pad having a first exposed surface exposed at a first surface of the substrate;
- a semiconductor chip formed on the first surface of the substrate;
- a first molding member formed on the first surface of the substrate and covering the semiconductor chip while not covering the first exposed surface; and
- a metal layer covering the first molding member and overlapping lateral surfaces of the substrate while contacting the first exposed surface,
- wherein the substrate includes a pair of first lateral surfaces facing each other in a first direction and a pair of second lateral surfaces facing each other in a second direction perpendicular to the first direction, and a recess region extends along the first lateral surfaces in the first direction, or along the second lateral surfaces in the second direction,
- wherein the recess region is not formed at corners where the first lateral surfaces and the second lateral surfaces meet.

* * * * *